(12) United States Patent
Wu (10) Patent No.: US 7,348,228 B2
(45) Date of Patent: Mar. 25, 2008

(54) DEEP BURIED CHANNEL JUNCTION FIELD EFFECT TRANSISTOR (DBCJFET)

(75) Inventor: Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 11/440,773

(22) Filed: May 25, 2006

(65) Prior Publication Data

US 2007/0275515 A1    Nov. 29, 2007

(51) Int. Cl.
*H01L 21/337* (2006.01)
(52) U.S. Cl. .............. 438/191; 438/186; 257/134
(58) Field of Classification Search ........... 438/186, 438/191; 257/134
See application file for complete search history.

(56) References Cited

U.S. PATENT DOCUMENTS

| | | | |
|---|---|---|---|
| 4,939,099 | A | 7/1990 | Seacrist et al. |
| 5,367,184 | A | 11/1994 | Chantre |
| 5,889,298 | A | 3/1999 | Plumton et al. |
| 5,945,699 | A | 8/1999 | Young |
| 6,163,052 | A | 12/2000 | Liu et al. |
| 6,551,865 | B2 * | 4/2003 | Kumar et al. ............. 438/137 |
| 6,861,678 | B2 | 3/2005 | Howard et al. |
| 6,909,125 | B2 | 6/2005 | Howard et al. |
| 2002/0139992 | A1 * | 10/2002 | Kumar et al. ............. 257/134 |
| 2004/0119076 | A1 | 6/2004 | Ryu |
| 2005/0006663 | A1 | 1/2005 | Howard et al. |
| 2005/0012111 | A1 | 1/2005 | Howard et al. |
| 2005/0067631 | A1 | 3/2005 | Pendharker et al. |
| 2005/0194621 | A1 | 9/2005 | Howard et al. |
| 2005/0230745 | A1 | 10/2005 | Fatemizadeh et al. |
| 2005/0247955 | A1 | 11/2005 | Howard et al. |
| 2006/0049435 | A1 | 3/2006 | Bill et al. |
| 2007/0170537 | A1 * | 7/2007 | Poenar et al. ............. 257/462 |

* cited by examiner

*Primary Examiner*—Fernando L. Toledo
(74) *Attorney, Agent, or Firm*—W. James Brady, III; Frederick J. Telecky, Jr.

(57) ABSTRACT

A junction field effect transistor (JFET) is fashioned where a channel of transistor is buried deeply within the workpiece within which the JFET is formed. Burying the channel below the surface of the workpiece and/or away from overlying conductive materials distances a current that flows in the channel from outside influences, such as the effects of the overlying conductive materials. The deep channel also provides a more regular path for the current flowing therein by moving the channel away from non-uniformities on or near the surface of the workpiece, where said non-uniformities or irregularities would interrupt or otherwise disturb current flowing in a channel that is not as deep. These aspects of the deep channel serve to reduce noise and allow the transistor to operate in a more repeatable and predictable manner, among other things.

20 Claims, 6 Drawing Sheets

DEEP BURIED CHANNEL JUNCTION FIELD EFFECT TRANSISTOR (DBCJFET)

FIELD OF INVENTION

The present invention relates generally to semiconductor processing, and more particularly to fashioning a junction field effect transistor (NJFET) that has a deeply buried channel (DBCJFET).

BACKGROUND OF THE INVENTION

It can be appreciated that different electronic devices may have different requirements depending upon a particular device's application. For example, high performance precision analog applications may require very low noise, simple yet precise component matching, high speed and long term matching stability. In addition to demanding low component noise and precise component matching, precision analog products also require that operations of critical components be reliable and un-modulated by other undesired sources such as overlying conducting metal buses. It would, therefore, be desirable to fashion transistors that operate with low noise, good matching and high disturbance immunity characteristics.

It can also be appreciated that transistors are basic building blocks of semiconductor circuitry and electronic devices. Accordingly, the type of transistor used depends upon the applications and the characteristics of the transistor. For example, junction field effect transistors (JFETs) generally exhibit very low 1/f noise and high input impedance. Complementary metal oxide semiconductor (CMOS) transistors, on the other hand, operate with a relatively higher level of noise and have a high impedance or low input current. Bipolar transistors, in contrast, accommodate good matching and, low noise, but exhibit a low impedance or a high input current. Given the desire for low noise in high performance precision analog applications and the propensity for JFET transistors to operate with low noise, it would thus be desirable to produce a JFET in a cost effective manner that allows the JFET to operate with even lower noise so that the JFET can be implemented in a high performance precision analog application.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The disclosure herein pertains to fashioning a junction field effect transistor (JFET) where a channel of transistor is buried deeply within the workpiece within which the JFET is formed. In this manner, the JFET is referred to as a deep buried channel junction field effect transistor (DBCJFET). Locating the channel below the surface of the workpiece and/or away from overlying conductive materials distances a current that flows in the channel from outside influences, such as the effects of the overlying conductive materials, for example. The deep channel also provides a more regular path for the current flowing therein by moving the channel away from non-uniformities on or near the surface of the workpiece, where said non-uniformities or irregularities interrupt or otherwise disturb current flow in a channel that is not as deep. These aspects of the deep channel serve to reduce noise and allow the transistor to operate in a more repeatable and predictable manner, among other things.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects and/or embodiments of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

An exemplary methodology 100 for forming a junction field effect transistor (JFET) is illustrated in FIG. 1, and FIGS. 2-11 are cross sectional views of a semiconductor substrate 200 wherein such a method is implemented. For purposes of simplicity and ease of understanding the method 100 is generally discussed in terms of forming a p channel JFET or PJFET. It will be appreciated, however, that the method has application to an n channel JFET or NJFET as well, where the electrical conductivity types are generally just reversed in NJFET and PJFET transistors. Additionally, while the method 100 is illustrated and described below as a series of acts or events, it will be appreciated that the present invention is not limited by the illustrated ordering of such acts or events.

For example, some acts may occur in different orders and/or concurrently with other acts or events apart from those illustrated and/or described herein. In addition, not all illustrated steps may be required to implement a methodology in accordance with one or more aspects and/or embodiments of the present invention. Further, one or more of the acts depicted herein may be carried out in one or more separate acts and/or phases.

Figure 1:
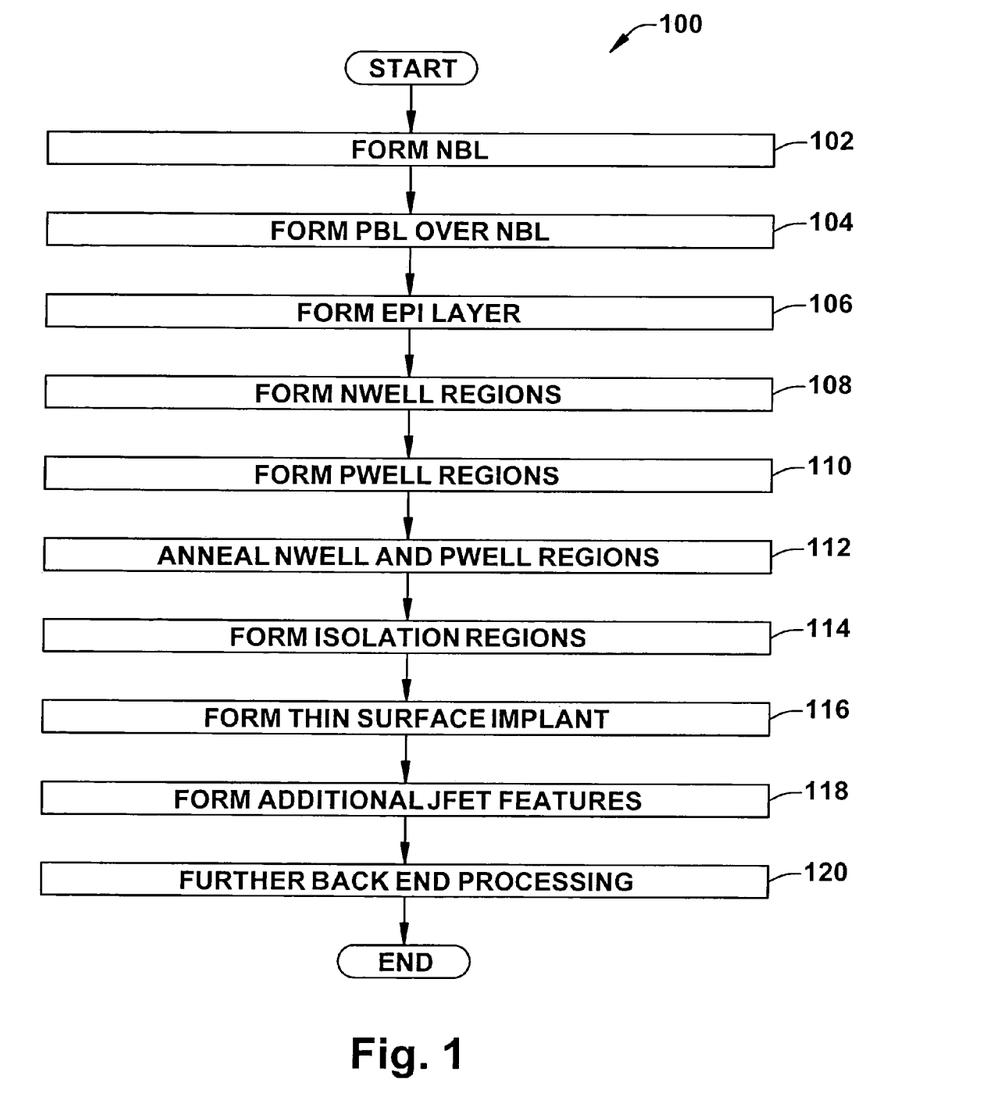
FIG. 1 is a flow diagram illustrating an exemplary methodology for forming a junction field effect transistor (JFET).
Figure 2:
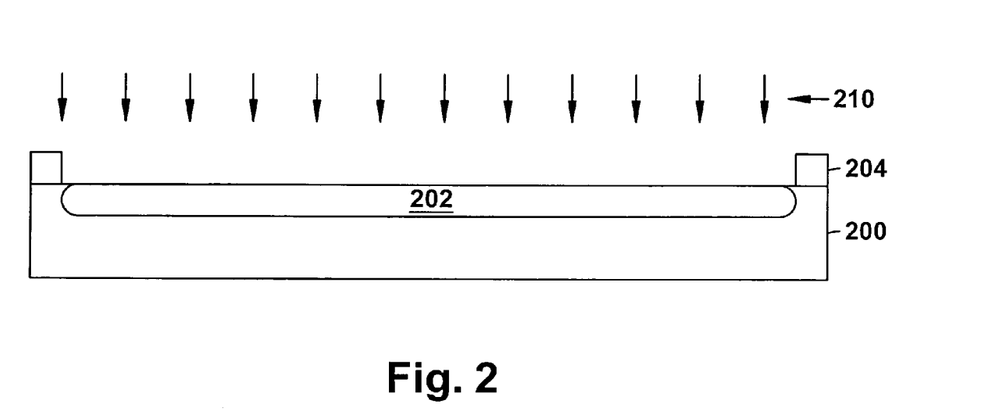
FIGS. 2-11 are cross-sectional views of a semiconductor substrate wherein an exemplary JFET is formed.

At the outset, an n type buried layer (NBL) 202 is formed within the semiconductor substrate or workpiece 200 at 102 (FIG. 2). The NBL 202 can be formed, for example, by forming and patterning a first resist 204 over the substrate 200 and performing a first (selective) implantation 210 of one or more n type dopants within the substrate 200. It will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. It will also be appreciated that the patterning of the first resist 204 (as with all masking and/or patterning mentioned herein) can be performed in any suitable manner, such as with lithographic techniques, for example, where lithography broadly refers to processes for transferring one or more patterns between various media. In lithography, a light sensitive resist coating (e.g., 208) is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Figure 3:
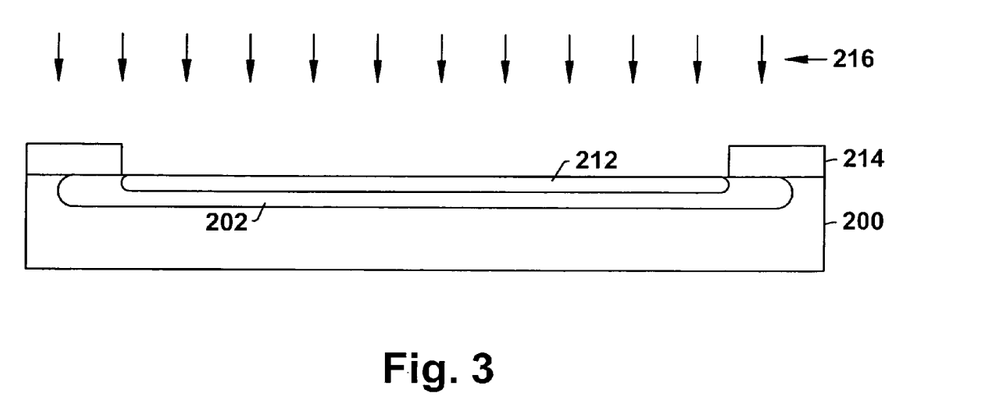

At 104 a p type buried layer (PBL) 212 is formed within the substrate 200 somewhat overlapping the NBL 202 (FIG. 3). Like the NBL 202, the PBL 212 can be formed, for example, by forming and patterning a second resist 214 over the substrate 200 and performing a second (selective) implantation 216 of one or more p type dopants within the substrate 200 (FIG. 2).

Figure 4:
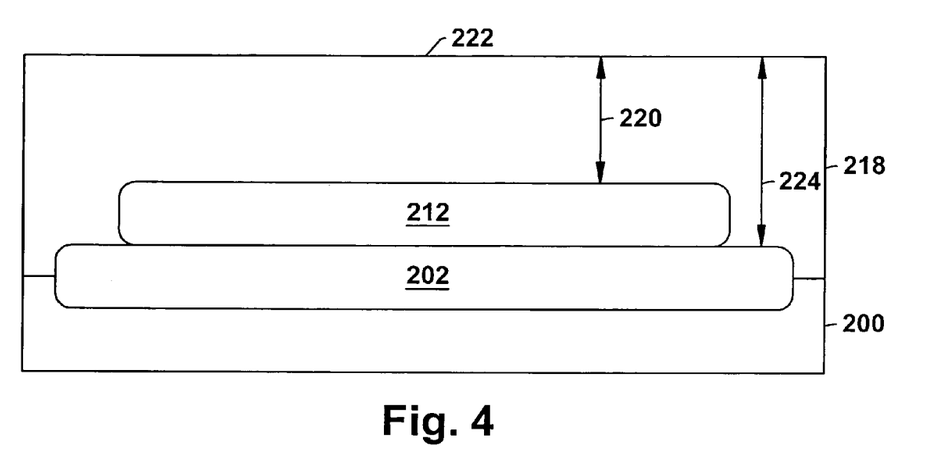

At 106 a p type epitaxial layer (EPI or PEPI) 218 is grown over the surface of the substrate 200 (FIG. 4). The PEPI 218 layer may have a dopant concentration of between about $0.5e^{15}/cm^3$ and about $1.5e^{15}/cm^3$, for example, and may be formed to a thickness of between about 2 microns and about 5 microns, for example. It will be appreciated that the workpiece may be subjected to elevated temperatures during the epitaxial growth process, and such elevated temperatures may cause the NBL 202 and PBL 212 to migrate upward as illustrated in FIG. 4. In particular, most, if not all, of the PBL 212 may migrate up into the EPI layer 218, and some of the NBL 202 may migrate up into the EPI layer 218 as well. Nevertheless, both the PBL 212 and the NBL 202 may remain relatively deep within the EPI layer 218, and as such the PBL 212 may be referred to as a deep PBL or DPBL, while the NBL 202 may be referred to as a deep NBL or DNBL. For example, the PBL 212 may remain at a distance 220 of between about 1 and about 4 microns below the surface 222 of the EPI layer 218, while the NBL 202 may remain at a distance 224 of between about 2.5 and about 5 microns below the surface 222 of the EPI layer 218.

As will be discussed in more detail below, it will be appreciated that the PBL 212 serves as a channel region in the resulting transistor where current can flow through the channel region in activating and deactivating the transistor. Additionally, the PBL 212 can initially be formed to be discontinuous or have uneven doping to so that a pinch off voltage of the transistor can be adjusted without requiring additional implantations. It will also be appreciated that the NBL 202 serves as a bottom or bottom gate of a gate of the transistor to isolate the PBL 212 channel region and to control the current flow in the PBL 212 channel.

Figure 5:
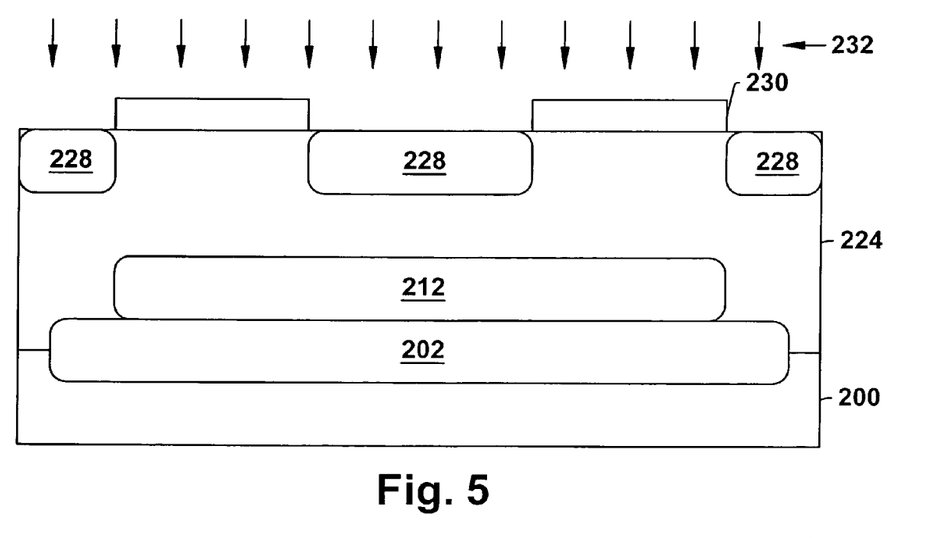
Figure 6:
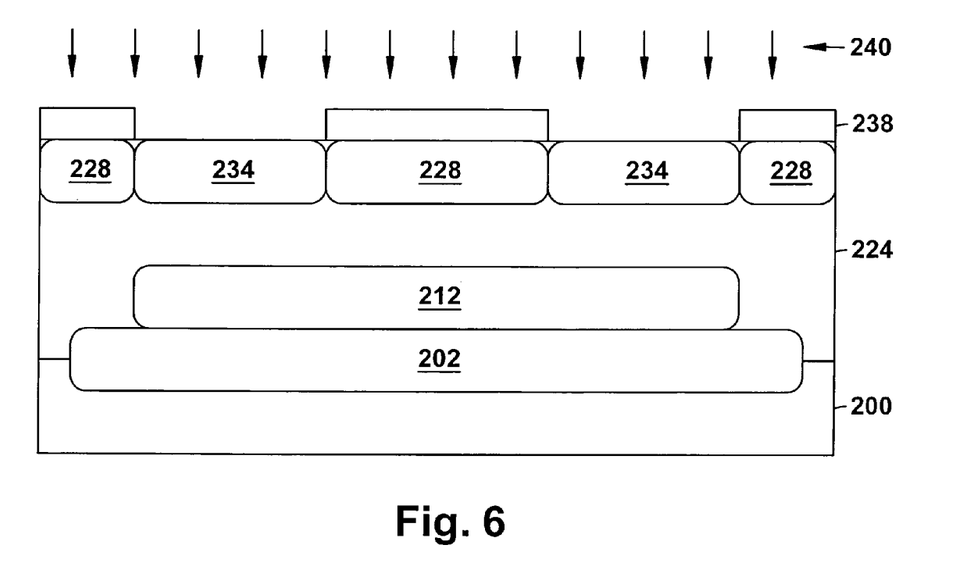
Figure 7:
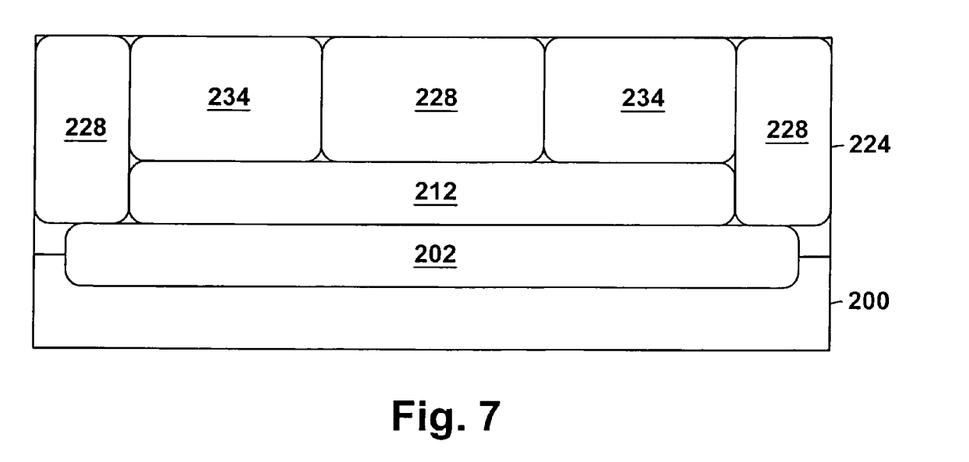

After the EPI 218 is grown, then n type well regions 228 are formed in the substrate above the NBL 202 and PBL 212 at 108 (FIG. 5). The n well regions 228 can be formed by forming and patterning a third resist 230 over the substrate 200 and performing a third (selective) implantation 232 of one or more n type dopants within the substrate 200. P type well regions 234 are then formed in the substrate at 110 (FIG. 6). The p well regions 234 are formed between the n well regions 228 and may be formed by forming and patterning a fourth resist 238 over the substrate 200 and performing a fourth (selective) implantation 240 of one or more p type dopants within the substrate 200. As will be appreciated, the p well regions 234 provide a link down to the PBL 212 channel regions. The workpiece is then subjected to an annealing or other type of heat treatment process at 112 to drive the nwell 228 and p well 234 regions down to the PBL 212 and NBL 202 (FIG. 7). This process may be performed for between about 3 hours and about 6 hours, for example. Both the n well 228 and p well 234 regions can be formed to have a dopant concentration of between about $1e^{16}/cm^3$ and about $1e^{17}/cm^3$, for example. Additionally, both the n well 228 and p well 234 regions can be formed with implantation energies of between about 0.5 MeV and about 1.5 MeV, for example.

Figure 8:
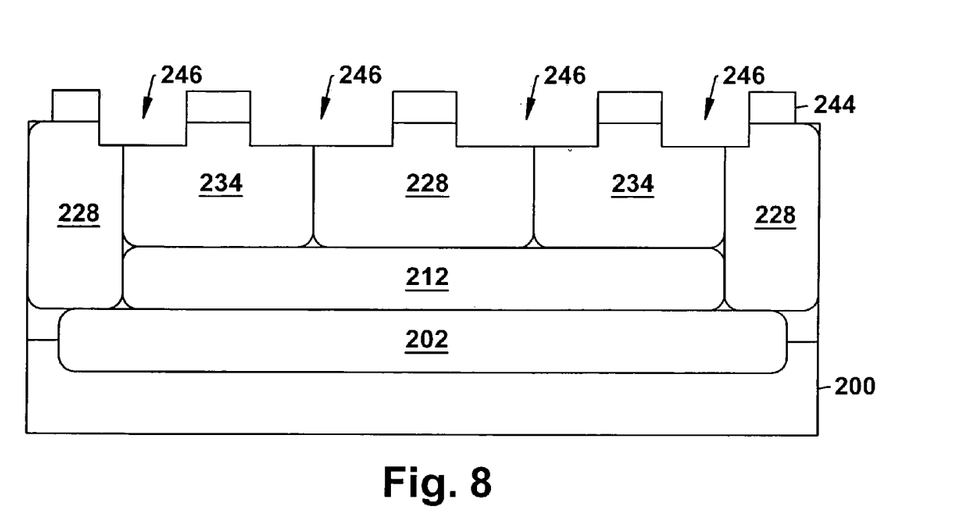
Figure 9:
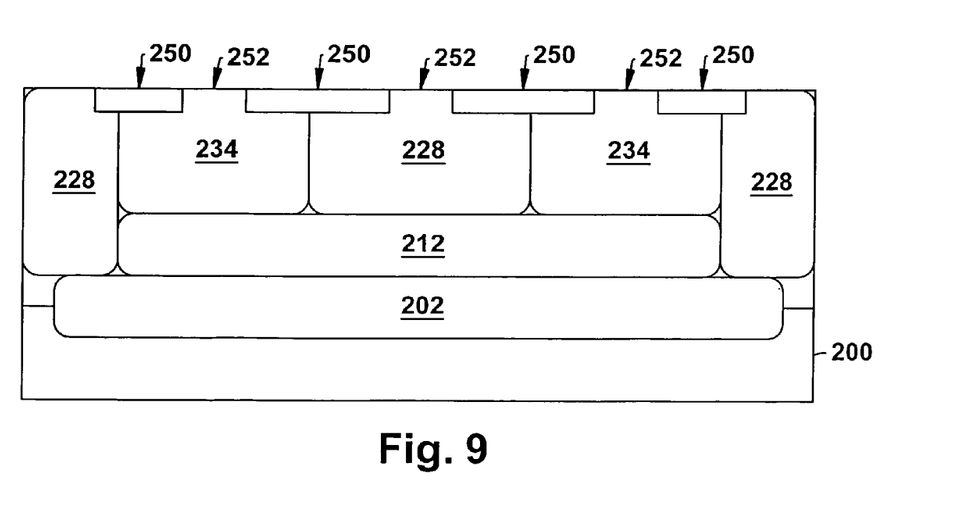

Isolation regions are then formed in the substrate 200 at 114 to separate areas where source, drain and gate regions are going to be formed in the substrate. The isolation regions may comprise shallow trench isolation (STI) or local oxidation of silicon (LOCOS), for example, and are formed by etching away portions of the substrate where the isolation regions are to be formed. This may comprise, for example, forming and pattering a mask 244 over the substrate 200 and then etching away exposed portions of the substrate to form trenches 246 therein (FIG. 8). The trenches 246 are then filled in with a dielectric or electrically non-conductive material to form the isolation regions 250 (FIG. 8). The isolation regions 250 may comprise an oxide based material that is deposited, for example. The patterned masking material 244 is stripped to expose areas 252 of the substrate 200 that are electrically isolated from one another by the isolation regions 250 (FIG. 9).

Figure 10:
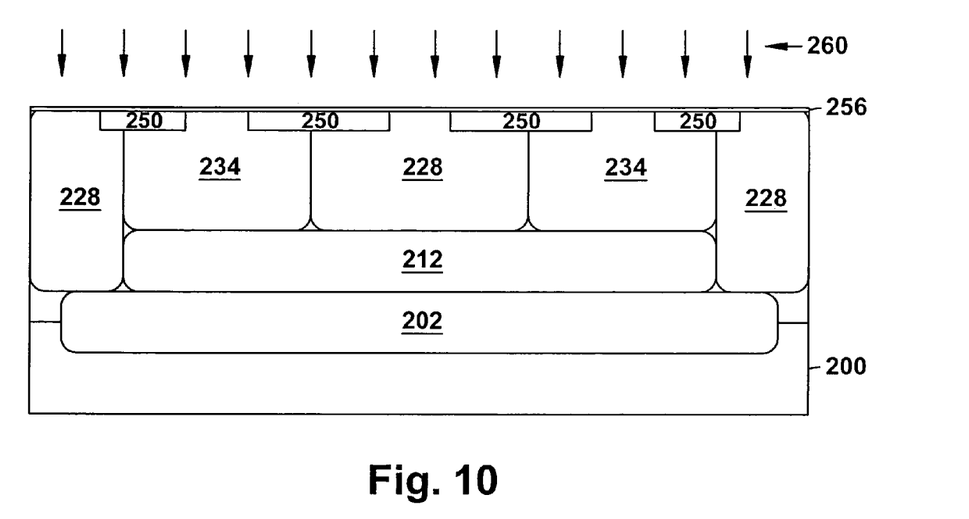

At 116 an optional thin surface shield 256 or skin implant is formed across the surface of the substrate 200 (FIG. 10). The surface shield 256 can be formed by implanting 260 an n type dopant at a doping concentration of between about $0.5e^{17}/cm^3$ and about $1.5e^{17}/cm^3$, for example. This may correspond, for example, to a Vt adjust implant performed as part of a CMOS fabrication process to adjust a threshold voltage Vt of one or more CMOS transistors formed in the process. In any event, the shield 256 facilitates forcing current flow away from the surface of the channel link 234 where irregularities may be present, such as from the isolation regions 250, for example, where such irregularities may adversely affect current flow and thus the (anticipated) operation of the device.

Figure 11:
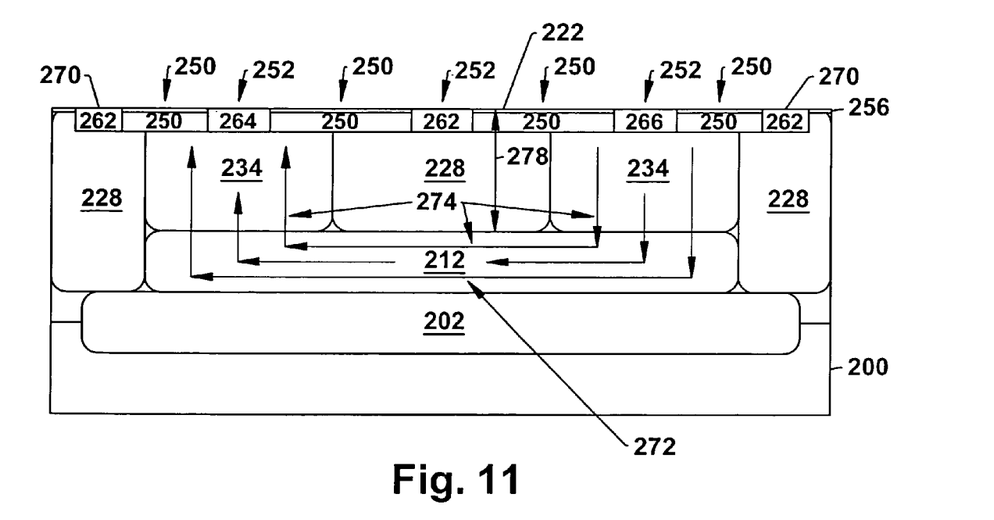

Once the surface shield 256 is formed, additional features are formed to complete the JFET at 118 (FIG. 11). In particular, LDD, MDD, or other extension implantations (not shown) can be performed, for example, depending upon the type(s) of transistors to be formed, and left and right sidewall spacers (also not shown) can also be formed to direct dopants into select locations within the substrate 200. Gate 262 regions (e.g., n type), and source 264 and drain 266 regions (e.g., p type) are formed by one or more subsequent maskings and implantations (not shown) in regions 252 of the substrate 200 separated by the isolation regions 250, where the peripheral gates 270 can be referred to as bottom gate ties since they are operatively coupled down to the NBL 202 via the n well regions 228. Similarly, the more centralized gate 228 can be referred to as a front gate. Additionally, the peripheral gates 270 generally comprise a donut shaped ring, whereas the central gate generally exists in a linear dimension coming into and out of the page. It will be appreciated that these implants overpower the skin implant 256 which may be performed at between about $0.5e^{17}/cm^3$ and about $1.5e^{17}/cm^3$, for example.

It will be appreciated that fashioning the JFET as described herein locates a channel region 272, through which current flows between the source 264 and drain 266 regions, down in the PBL 212, where the current flow is illustrated by arrows 274 in FIG. 11. Locating the channel region 272 substantially below the surface of the EPI layer 218, as opposed to right under the central gate structure, provides for much smoother and un-modulated current flow, which in turn has several advantages including, but not limited to, lower noise 1/F, better matching and DC stability, less charge spreading (particularly in higher voltage applications), less gate leakage, higher transconductance (Gm), and overall better reliability and predictability of device operations as well as increased device longevity.

Among other things, an abundance of dangling bonds exists at the surface termination of the EPI layer 218, where such dangling bonds can adversely affect current flow such that, at least, the above benefits are realized by deeply burying the channel 272. Additionally, burying the channel region 272 as described herein mitigates adverse effects (e.g., charge spreading) that can result from overlying conductive materials. The channel region may, for example, be located at a distance 278 of between about 1 and about 4 microns below the surface 222 of the EPI layer 218, where the PBL 212 acts as a plug to distance the channel region 272, and thus the current flowing therein, from the surface 222 of the EPI layer 218. After these remaining JFET features are formed, the method advances to 120 and ends thereafter, wherein further back end processing can be performed at 120, such as the formation and/or patterning of one or more additional conductive and/or non-conductive layers.

It will be appreciated that a mask 214 used to form the (deep) PBL 212 at 104 (FIG. 3) may be patterned such that dopant atoms are not implanted in a continuum across the NBL 202 (e.g., so that there are two or more PBL regions that are laterally adjacent to one another and that are separated by an undoped or "open" region). Dopant atoms will, nevertheless, migrate (laterally) during a subsequent anneal so that undoped or "open" regions don't exist in the DPBL, but that a single continuous PBL 212 instead exists as is illustrated in FIG. 3. Nevertheless, even though the doped regions "re-connect" due to dopant migration, the concentration of dopant atoms may be lower in the formerly "open" regions such that a pinch off voltage is easily attained through these regions (e.g., by applying a voltage to the top gate and the back or bottom gate). The concentration of migrant dopant atoms in the formerly open regions is sufficient, though, to mitigate shorting or leakage through the PBL (e.g., between the top gate and the back gate).

It will also be appreciated that forming the deep buried channel JFET as described herein can be readily integrated into a standard CMOS fabrication process, without requiring any, or very few, modifications to the fabrication processes. As such, the DBCJFET described herein can be produced in a cost effective manner, which satisfies an ongoing desire in semiconductor fabrication. Also, as alluded to previously, while a PJFET has been described herein, an n channel junction field effect transistor (NJFET) can also be fashioned as described herein, where the electrical conductivity types would merely be reversed. For example, the n and p type regions in the PJFET would instead be fashioned as p and n type regions, respectively, in the NJFET by implanting p and n type dopants, respectively, instead of n and p type dopants. Additionally, while the epitaxial layer(s) in the PJFET are generally n type, they may also be p type where they are subsequently doped to have the desired electrical conductivity. Note that this is also true for the NJFET, where the epitaxial layer(s) are generally n type, but may be p type and subsequently doped to have the desired electrical conductivity.

Further, while reference is made throughout this document to exemplary structures in discussing aspects of one or more methodologies described herein (e.g., those structures presented in FIGS. 2-11 while discussing the methodology set forth in FIG. 1), it will be appreciated that those methodologies are not to be limited by the corresponding structures presented. Rather, the methodologies (and structures) are to be considered independent of one another and able to stand alone and be practiced without regard to any of the particular aspects depicted in the Figs. Additionally, the structures and/or layers described herein can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another for purposes of simplicity and ease of understanding, and that actual dimensions may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A method of forming a junction field effect transistor (JFET), comprising:

forming a first buried layer of a first electrical conductivity type in a semiconductor substrate;

forming a second buried layer of a second electrical conductivity type over the first buried layer;

forming an epitaxial layer over the surface of the substrate, were forming the epitaxial layer causes the first buried layer and the second buried layer to migrate up toward the surface of the epitaxial layer, where the second buried layer gets closer to the surface of the epitaxial layer than the first buried layer;

forming first well regions having the first electrical conductivity type in the epitaxial layer;

forming second well regions having the second electrical conductivity type in the epitaxial layer, the second well regions being formed adjacent to the first well regions;

driving at least some of the first well regions down to at least the second buried layer;

driving the second well regions down to the second buried layer;

forming a gate region in a first well region that is situated over the second buried layer;

forming a source region in a second well region adjacent to the first well region wherein the gate region is formed; and forming a drain region in a second well region adjacent to the first well region wherein the gate region is formed, where the first well region wherein the gate region is formed acts as a plug to force current that flows between the source and drain regions to flow in the second well region wherein the source region is formed, the second well region wherein the drain region is formed and the second buried layer, where the second buried layer thereby serves as a channel region.

2. The method of claim 1, where the channel region is located between about 1 and about 4 microns below the surface of epitaxial layer.

3. The method of claim 1, further comprising:
forming a surface shield having the first electrical conductivity type in the surface of the epitaxial layer.

4. The method of claim 2, further comprising:
forming a surface shield having the first electrical conductivity type in the surface of the epitaxial layer.

5. The method of claim 2, further comprising:
forming isolation regions within the epitaxial layer, where the gate, source and drain regions are formed in the epitaxial layer between isolation regions.

6. The method of claim 4, further comprising:
forming isolation regions within the epitaxial layer, where the gate, source and drain regions are formed in the epitaxial layer between isolation regions.

7. The method of claim 6, where at least one of the first buried layer is separated from the surface of the epitaxial layer by a distance of between about 2.5 microns and about 5 microns, and the second buried layer is separated from the surface of the epitaxial layer by a distance of between about 1 micron and about 4 microns.

8. The method of claim 7, where at least one of the epitaxial layer has a dopant concentration of between about $0.5e^{15}/cm^3$ and about $1.5e^{15}/cm^3$, the epitaxial layer is formed to a thickness of between about 2 microns and about 5 microns.

9. The method of claim 8, where at least one of
the first well regions are formed to have a dopant concentration of between about $1e^{16}/cm^3$ and about $1e^{17}/cm^3$,
the second well regions are formed to have a dopant concentration of between about $1e^{16}/cm^3$ and about $1e^{17}/cm^3$,
the first well regions are formed with implantation energies of between about 0.5 MeV and about 1.5 MeV, and
the second well regions are formed with implantation energies of between about 0.5 MeV and about 1.5 MeV.

10. The method of claim 1, where driving the first and second well regions down to the first and second buried layers comprises:
subjecting the first and second well regions to a heat treatment process for between about 3 hours and about 6 hours.

11. The method of claim 4, where the surface shield is formed to have a dopant concentration of between about $0.5e^{17}/cm^3$ and about $1.5e^{17}/cm^3$.

12. A junction field effect transistor (JFET), comprising:
a first buried layer of a first electrical conductivity type in a semiconductor substrate;
a second buried layer of a second electrical conductivity type over the first buried layer;
an epitaxial layer over the surface of the substrate, where the second buried layer is closer to the surface of the epitaxial layer than the first buried layer;
first well regions having the first electrical conductivity type in the epitaxial layer;
second well regions having the second electrical conductivity type in the epitaxial layer, the second well regions adjacent to the first well regions, at least some of the first well regions extending down to at least the second buried layer, and the second well regions extending down to the second buried layer;
a gate region in a first well region that is situated over the second buried layer;
a source region in a second well region adjacent to the first well region wherein the gate region is formed; and
a drain region in a second well region adjacent to the first well region wherein the gate region is formed, where the first well region wherein the gate region is formed acts as a plug to force current that flows between the source and drain regions to flow in the second well region wherein the source region is formed, the second well region wherein the drain region is formed and the second buried layer, where the second buried layer thereby serves as a channel region.

13. The transistor of claim 12, where the channel region is located between about 1 and about 4 microns below the surface of epitaxial layer.

14. The transistor of claim 12, further comprising:
a surface shield having the first electrical conductivity type in the surface of the epitaxial layer.

15. The transistor of claim 13, further comprising:
a surface shield having the first electrical conductivity type in the surface of the epitaxial layer.

16. The transistor of claim 13, further comprising:
isolation regions within the epitaxial layer, where the gate, source and drain regions are formed in the epitaxial layer between isolation regions.

17. The transistor of claim 15, further comprising:
isolation regions within the epitaxial layer, where the gate, source and drain regions are formed in the epitaxial layer between isolation regions.

18. The transistor of claim 17, where at least one of
the first buried layer is separated from the surface of the epitaxial layer by a distance of between about 2.5 microns and about 5 microns,
the second buried layer is separated from the surface of the epitaxial layer by a distance of between about 1 micron and about 4 microns,
the epitaxial layer has a dopant concentration of between about $0.5e^{15}/cm^3$ and about $1.5e^{15}/cm^3$, and
the epitaxial layer is formed to a thickness of between about 2 microns and about 5 microns.

19. The transistor of claim 18, where at least one of
the first well regions are formed to have a dopant concentration of between about $1e^{16}/cm^3$ and about $1e^{17}/cm^3$,
the second well regions are formed to have a dopant concentration of between about $1e^{16}/cm^3$ and about $1e^{17}/cm^3$,
the first well regions are formed with implantation energies of between about 0.5 MeV and about 1.5 MeV, and
the second well regions are formed with implantation energies of between about 0.5 MeV and about 1.5 MeV.

20. The transistor of claim 15, where the surface shield is formed to have a dopant concentration of between about $0.5e^{17}/cm^3$ and about $1.5e^{17}/cm^3$.

* * * * *